United States Patent [19]

Bichler

[11] Patent Number: 5,075,582
[45] Date of Patent: Dec. 24, 1991

[54] INTEGRATABLE BANDPASS FILTER CIRCUIT

[75] Inventor: Helmut Bichler, Graefelfing, Fed. Rep. of Germany

[73] Assignee: Siemens Aktiengesellschaft, Munich, Fed. Rep. of Germany

[21] Appl. No.: 487,933

[22] Filed: Mar. 5, 1990

[30] Foreign Application Priority Data

Mar. 30, 1989 [EP] European Pat. Off. ........ 89105643.4

[51] Int. Cl.⁵ .......................... H03B 1/00; H03K 5/00
[52] U.S. Cl. .................................... 307/520; 307/521; 328/167; 330/260; 330/294
[58] Field of Search ............... 307/520, 521, 320, 491; 328/167; 330/294, 306, 107, 260

[56] References Cited

U.S. PATENT DOCUMENTS

| 3,614,478 | 10/1971 | Schiff | 307/521 |
| 4,335,359 | 6/1982 | Kriedt et al. | 330/294 |
| 4,859,962 | 8/1989 | Simons et al. | 330/260 |

OTHER PUBLICATIONS

Tietze et al., "Halbleiter-Schaltungstechnik", Springer-Verlag, Berlin, Heidelberg, New York, 1980, pp. 307-312.

Primary Examiner—Timothy P. Callahan

[57] ABSTRACT

An integratable filter has a bandplass behavior and comprises a power source which is controllable with negative feedback by way of a resistor and a capacitor and whose output is charged with a further capacitor.

4 Claims, 1 Drawing Sheet

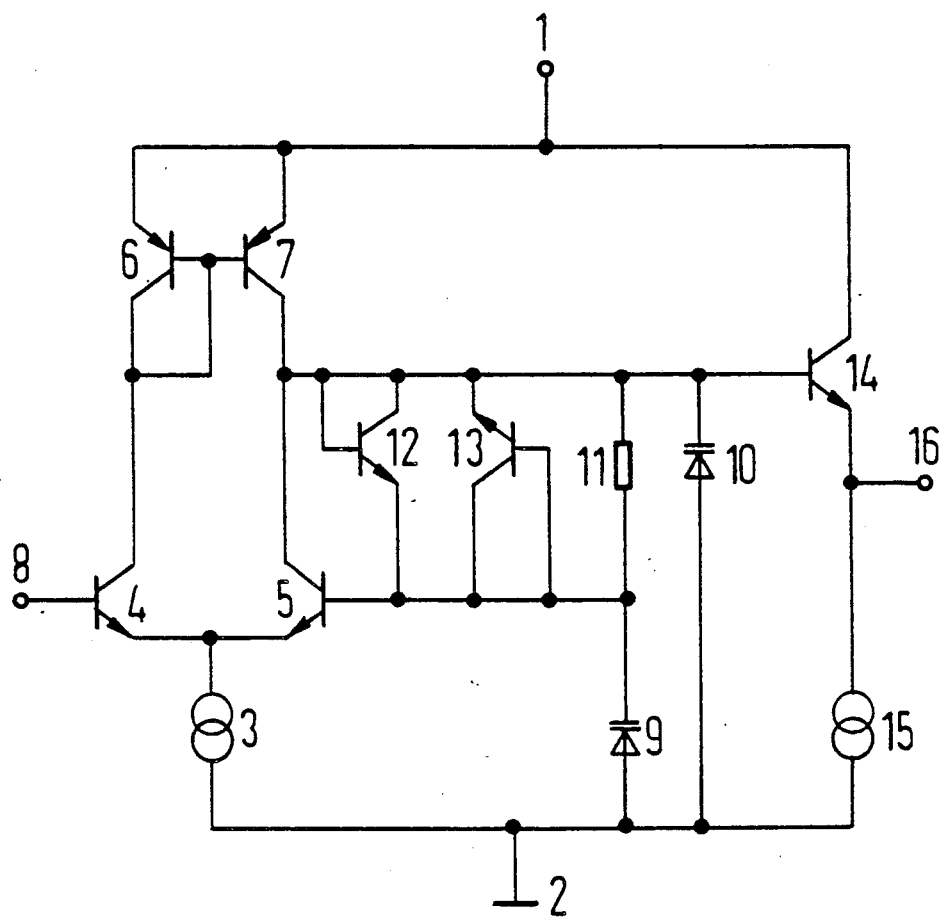

INTEGRATABLE BANDPASS FILTER CIRCUIT

BACKGROUND OF THE INVENTION

1. Field of the Invention

The present invention relates to filter circuits and is more particularly concerned with an integratable filter circuit which has a bandpass filter characteristic.

2. Description of the Prior Art

Integrated circuits for analog signal processing frequently contain filter circuits in order to suppress undesired disturbances. Therefore, bandpass filters are very frequently employed, for example for filtering out narrow band useful signals from broadband noise signals. The filter circuits are thereby preferably designed such that an optimally low, external wiring expense is needed for setting the center frequency. Since suitable capacitances and inductances were heretofore very difficult to realize in integrated technology or, respectively, could not be realized at all in integrated technology, external elements, particularly capacitors, are usually utilized as elements for setting the center frequency.

For example, bandpass filters having a network composed of two resistors and two capacitors in the feedback loop of an operational amplifier are known from U. Tietze and Ch. Schenk, Halbleiterschaltungstechnik, 5th Edition 1980, pp. 300 et sec, whereby a maximum of one of the two capacitors is connected to the reference potential. Since the operational amplifier as well as the two resistors can be realized in integrated technology, only the two capacitors have to be externally connected thereto. To that end, however, at least three further terminals must be provided for the circuit under consideration.

SUMMARY OF THE INVENTION

It is therefore an object of the invention to provide a filter circuit having a bandpass characteristic in which a smaller number of additional terminals for external elements is required.

In a filter circuit of the type set forth above, the above object is achieved in an integratable filter circuit having a bandpass characteristic, which is particularly characterized by a controllable power source, by a first capacitor lying, first of all, at a reference potential and connected, secondly, to the output of the controllable power source, and by a negative feedback network having a second capacitor lying, first of all, at the reference potential and, secondly, connected to an input of the controllable power source and having a resistor connected between the negative feedback input and the output of the controllable power source.

According to another feature of the invention, an integratable filter circuit of the type described above is particularly characterized in that a differential amplifier with a power output is provided as the controllable power source.

According to another feature of the invention, the integratable filter circuit is particularly characterized in that integratable capacitor diodes are provided as the first and second capacitors.

According to another feature of the invention, a pair of diodes connected anti-polar with respect to one another are connected in parallel across the resistor of the negative feedback network.

According to another feature of the invention, an output stage is connected to the output of the controllable power source.

An advantage to be gained in practicing the present invention is that a maximum of two further external terminals are required given a low internal wiring expense.

BRIEF DESCRIPTION OF THE DRAWING

Other objects, features and advantages of the invention, its organization, construction and operation will be best understood from the following detailed description, taken in conjunction with the accompanying drawing on which there is a single FIGURE which is a schematic circuit diagram of a filter circuit constructed in accordance with the present invention.

DESCRIPTION OF THE PREFERRED EMBODIMENTS

Referring to the drawing, an exemplary embodiment of the invention is illustrated in which the filter circuit comprises a differential amplifier 3-7 having two npn transistors 4 and 5 whose collectors are each respectively connected via a current branch of a current mirror 6 and 7 to a supply potential 1 and whose coupled emitters are connected via a power source 3 to a reference potential 2. A pnp transistor 6 forming the input branch 2 of the current mirror 6, 7 is connected via its emitter to the supply potential 1 and is interconnected via its base and collector to the collector of the transistor 4 whose base is provided as a non-inverting input 8 of the differential amplifier 3-7. The output current branch of the current mirror 6, 7 is established by a pnp transistor 7 that has its emitter connected to the supply potential 1, its base connected to the base of the transistor 6 and its collector connected to the collector of the transistor 5. A resistor 11 is connected between the collector and the base of the transistor 5 that are provided as the output and, respectively, inverting input of the differential amplifier 3-7. Moreover, a capacitor diode 9 is connected from the base of the transistor 5 to the reference potential 2 and a further capacitor diode 10 is connected from the collector of the transistor 5 to the reference potential 2. The collector of the transistor 5 is followed by an emitter follower having an non transistor 14 whose emitter forms the output 16 of the filter, the emitter being further connected by way of a power source 15 to the reference potential 2, and a collector which is connected to the supply potential 1. In addition, two npn transistors 12 and 13 respectively operate as diodes by connecting the base and collector of each transistor together, and these transistors are connected in an anti-polar manner relative to one another and in parallel to one another between the base and the collector of the transistor 5.

The operation of the filter circuit constructed in accordance with the present invention is based on the fact that a $\pi$ element respectively composed of a capacitor 9, 10 in the two shunt arms and of a resistor 11 in the series arm is operated with a power drive at its input side. For example, all types of power sources controllable by an input signal are suitable as a power drive. Due to the power drive at the shunt arm of the $\pi$element on the input side, a dependency on the frequency of the input signal arises such that the capacitor lying in this shunt arm, namely the capacitor diode 9 in the present exemplary embodiment, as a higher impedance at low frequencies and a lower impedance at high frequencies.

The voltage drop at the capacitor, with reference to the input signal, is therefore smaller at high frequencies than at low frequencies and a low-pass filter behavior therefore arises. The following RC low-pass filter forming the negative feedback network of a controllable power source and composed of the resistor 11 and the series arm and of the capacitor diode 10 in the shunt arm is connected with the voltage appearing at the capacitor diode 9. This RC low-pass filter, however, lies in the negative feedback branch of the controllable power source and therefore acts as a high-pass filter. An overall bandpass behavior derives due to the collaboration of the high-pass behavior and the low-pass behavior of the individual branches of the $\pi$ element.

A differential amplifier 3–7 whose output circuits contain a current mirror 6, 7 is provided as the controllable power source in the present exemplary embodiment. This design yields the advantage of a low circuit expense.

According to a particular feature of the invention, co-integratable capacitor diodes 9 and 10 are provided as the capacitors of the $\pi$ filter, these being easy to realize in an advantageous manner due to the fact that both capacitors are connected to the reference potential 2 and parasitic capacitances appearing in the remaining portions of the circuit have only a slight influence on the filter circuit. As a result thereof, no external capacitors and, therefore, no additional terminals are required in the integrated circuit.

According to another feature of the invention, two diodes connected in an anti-polar manner relative to one another are provided between the collector and the base of the transistor 5. In the illustrated exemplary embodiment, these diodes are established by the two correspondingly-driven transistors 12 and 13. The diodes advantageously enhance the overdrive resistance of the filter circuit.

A following output stage comprises a transistor 14 and a power source 15 and is preferably employed when the load connected to the output 16 has a high or fluctuating internal capacitance. The advantage is thereby achieved that reactions of the low capacitance onto the $\pi$ element are kept slight.

It should be pointed out that other embodiments of the output stage are also possible insofar as a decoupling of the filter circuit and load circuit is thereby achieved. However, different embodiments of the controllable power source may likewise be employed, such as, for example, an inverting driveable power source, whereby the negative feedback network is then connected to a common input of the power source. In addition to this, further developments of the capacitances in addition to the realization with internal capacitor diodes or remote capacitors are within the scope of the invention.

Although I have described my invention by reference to particular illustrative embodiments thereof, many changes and modifications of the invention may become apparent to those skilled in the art without departing from the spirit and scope of the invention. I therefore intend to include within the patent warranted hereon all such changes and modifications as may reasonably and properly be included within the scope of my contribution to the art.

I claim:

1. An integratable filter circuit comprising:
   a controllable power source including an input for receiving an input signal to be filtered, a negative feedback input, and an output;
   a filter capacitor connected to a reference potential and to said output of said controllable power source; and
   a negative feedback network including a second capacitor connected to the reference potential and to said negative feedback input of said controllable power source, and a resistor connected between said output of said controllable power source, said output of said power source constituting the output, of said integratable filter circuit, first and second diodes connected in an opposite polarity manner with respect to one another and in parallel across said resistor of said negative feedback network.

2. An integratable filter circuit comprising:
   first, second, third and fourth transistors each including a base, an emitter and a collector, and a power source, said first, second, third and fourth transistors and said power source interconnected to form a differential amplifier;
   said base of said first transistor serving as an input of said differential amplifier and of said integratable filter circuit;
   said base of said second transistor serving as a negative feedback input of said differential amplifier;
   said emitters of said first and second transistors connected to said power source and said power source connected to a reference potential;
   said collectors of said first and third transistors connected together and to said bases of said third and fourth transistors;
   said collectors of said second and fourth transistors connected together and serving as an output of said differential amplifier;
   said emitters of said third and fourth transistors connected together and connected to a supply potential; and
   a $\pi$ filter element including a drive connected to said output of said differential amplifier and including a first capacitor diode in a first shunt branch and a second capacitor diode in a second shunt branch and a resistor in a series branch connected between said first and second capacitor diodes and across said output and said negative feedback input of said differential amplifier, said first and second capacitor diodes connected in parallel across said resistor, said capacitor diodes connected to the reference potential, and said drive input connected to said output of said differential amplifier, said output of said differential amplifier constituting the output of the integratable filter circuit.

3. The integratable filter circuit of claim 2 and further comprising:
   third and fourth diodes each connected across said resistor, and each comprising a transistor including a base, a collector connected to said base, and an emitter, said collector and said emitter connected across said resistor with their collector-emitter paths connected in an opposite polarity manner across said resistor.

4. The integratable filter circuit of claim 2, and further comprising:
   an output stage including a further power source and a fifth transistor comprising a base connected to said output of said controllable power source, a collector connected to a supply potential and an emitter serving as an output for said integratable filter circuit, said emitter connected to the reference potential via said another power source.

* * * * *